(12) United States Patent
Lee et al.

(10) Patent No.: US 9,859,660 B2
(45) Date of Patent: Jan. 2, 2018

(54) MEMORY CARD ADAPTER

(71) Applicant: Samsung Electronics Co., Ltd., Suwon-si, Gyeonggi-do (KR)

(72) Inventors: In-jae Lee, Hwaseong-si (KR); Gwang-man Lim, Seoul (KR); Ki-woong Yoo, Jeonju-si (KR); Soo-Jung Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/141,363

(22) Filed: Apr. 28, 2016

(65) Prior Publication Data

US 2016/0352048 A1 Dec. 1, 2016

(30) Foreign Application Priority Data

Jun. 1, 2015 (KR) ........................ 10-2015-0077482

(51) Int. Cl.
| | |
|---|---|
| *H01R 31/06* | (2006.01) |
| *H01R 13/652* | (2006.01) |
| *H01R 13/648* | (2006.01) |
| *H01R 12/73* | (2011.01) |
| *H05K 5/02* | (2006.01) |

(52) U.S. Cl.
CPC ......... *H01R 13/648* (2013.01); *H01R 12/732* (2013.01); *H01R 31/06* (2013.01); *H05K 5/0282* (2013.01)

(58) Field of Classification Search
CPC ...... H01R 31/06; H01R 24/542; H01R 24/62; H01R 24/60; H01R 13/648; H01R 13/652; H01R 23/688; H01R 23/6873

USPC ... 439/638, 660, 108, 951, 497, 579, 607.58
See application file for complete search history.

(56) References Cited

U.S. PATENT DOCUMENTS

| | | | | |
|---|---|---|---|---|
| 4,736,275 A | * | 4/1988 | Kendall | ................. H05K 1/117 174/261 |
| 5,679,008 A | * | 10/1997 | Takahashi | ............ H01R 9/0515 439/497 |
| 6,804,119 B2 | * | 10/2004 | Ziemkowski | ...... H01R 13/6485 361/715 |
| 6,979,227 B2 | | 12/2005 | Ikeda | |
| 7,059,913 B1 | * | 6/2006 | Chen | ...................... H01R 31/06 439/638 |
| 7,255,606 B2 | | 8/2007 | Tanaka et al. | |
| 7,341,194 B2 | | 3/2008 | Lin | |

(Continued)

FOREIGN PATENT DOCUMENTS

KR 10-1559729 10/2015

*Primary Examiner* — Gary Paumen
(74) *Attorney, Agent, or Firm* — Myers Bigel, P.A.

(57) ABSTRACT

A memory card adaptor may include a plurality of card-side terminals arranged to contact terminals of a memory card, a plurality of socket-side terminals arranged in a first direction to contact terminals of a host socket and including at least two socket-side ground terminals, wiring lines configured to electrically connect the plurality of card-side terminals to the plurality of socket-side terminals in a one-to-one correspondence, a ground frame configured to electrically connect the at least two socket-side ground terminals to each other, and a housing that accommodates the plurality of card-side terminals, the plurality of socket-side terminals, and the wiring lines. The memory card adaptor may have good electrical characteristics, and thus may be able to stably operate even during fast data transmission.

20 Claims, 13 Drawing Sheets

(56) References Cited

U.S. PATENT DOCUMENTS

| | | | |
|---|---|---|---|
| 7,371,119 B1 | 5/2008 | Lee | |
| 7,404,741 B2 * | 7/2008 | Tanaka | G06K 19/07735 |
| | | | 439/630 |
| 8,011,950 B2 * | 9/2011 | McGrath | H01R 12/594 |
| | | | 439/497 |
| 8,157,596 B1 | 4/2012 | Little et al. | |
| 8,292,655 B1 * | 10/2012 | Ling | H01R 9/038 |
| | | | 439/497 |
| 8,482,128 B2 | 7/2013 | Lin et al. | |
| 8,900,007 B2 * | 12/2014 | Nonen | H01R 9/037 |
| | | | 439/497 |
| 8,979,576 B2 * | 3/2015 | Nonen | H01R 4/04 |
| | | | 439/497 |
| 2007/0004285 A1 * | 1/2007 | Lee | H05K 5/0282 |
| | | | 439/638 |
| 2008/0153358 A1 * | 6/2008 | Tanaka | G06K 7/0021 |
| | | | 439/638 |
| 2010/0233907 A1 * | 9/2010 | Wu | H01R 9/03 |
| | | | 439/607.58 |
| 2014/0127947 A1 | 5/2014 | Han | |
| 2014/0198460 A1 | 7/2014 | Chuang et al. | |

\* cited by examiner

MEMORY CARD ADAPTER

CROSS-REFERENCE TO RELATED APPLICATION

This application claims priority under 35 USC §119(a) to Korean Patent Application No. 10-2015-0077482, filed on Jun. 1, 2015, in the Korean Intellectual Property Office, the contents of which are incorporated herein by reference in their entirety.

BACKGROUND

The inventive concepts relates to memory card adaptors, and more particularly, to memory card adaptors that have good electrical characteristics and are capable of stable operation during fast data transmission.

Recently, various kinds of memory devices (e.g., non-volatile memory devices) used as an auxiliary memory of mobile devices, such as mobile phones or digital cameras, have been manufactured with the development of technology of storage media. For example, various kinds of memory devices may include a CompactFlash card, a multimedia card, and/or a Secure Digital (SD) card.

As such, various memory card standards exist, and the shapes or sizes of the memory cards may be different according to the types thereof. Accordingly, adaptors for accommodating various shapes or sizes of memory cards may be used. As the amount of data stored increases, fast data transmission is needed.

SUMMARY

The inventive concepts provide memory card adaptors that have good electrical characteristics and are capable of stably operating even during fast data transmission.

According to an aspect of the inventive concept, there a memory card adaptor may include a plurality of card-side terminals arranged to be able to contact terminals of a memory card, a plurality of socket-side terminals arranged in a first direction to be able to contact terminals of a host socket and comprising at least two socket-side ground terminals, wiring lines configured to electrically connect the plurality of card-side terminals to the plurality of socket-side terminals in a one-to-one correspondence, a ground frame configured to electrically connect at least two socket-side ground terminals to each other, and a housing that accommodates the plurality of card-side terminals, the plurality of socket-side terminals, and the wiring lines. The ground frame may include a first ground sub-frame that extends along side surfaces of the at least two socket-side ground terminals.

The first ground sub-frame may overlap with front end side surfaces of the plurality of socket-side terminals. The ground frame may further include a second ground sub-frame extending in a second direction that is perpendicular to the first direction. The first ground sub-frame may overlap with front end side surfaces of the plurality of socket-side terminals, and may be connected to a second ground sub-frame that extends in a second direction that is perpendicular to the first direction.

The ground frame may further include a third ground sub-frame that is adjacent to the plurality of card-side terminals and is electrically connected to the first ground sub-frame. The third ground sub-frame may extend in the first direction. The plurality of card-side terminals may include at least one card-side ground terminal, and the third ground sub-frame may be electrically connected to at least one of the plurality of card-side ground terminals without being connected to the at least two socket-side ground terminals. The ground frame may encompass the plurality of socket-side terminals, the wiring lines, and the plurality of card-side terminals. The ground frame may be a closed loop. The closed loop may include two closed sub-loops that share one of the plurality of card-side terminals.

The ground frame may at least partially meet a plane that is formed by upper surfaces of the plurality of socket-side terminals or a plane that is formed by lower surfaces of the plurality of socket-side terminals.

The ground frame may further include a fourth ground sub-frame that is spaced apart from the wiring lines and extends over the wiring lines. The fourth ground sub-frame may be connected to a wiring line which in turn is connected to one of the at least two socket-side ground terminals.

The plurality of card-side terminals may be configured according to an interface standard of a Secure Digital (SD) card, a miniSD card, a microSD card, a multimedia card, a reduced size multimedia card, a Universal Flash Storage (UFS) card, or a Universal Serial Bus (USB) memory storage device. The wiring lines may be formed on a printed circuit board (PCB). The ground frame may form a closed loop, and the closed loop may include two closed sub-loops that share the ground terminal.

According to other aspects of the inventive concepts, a memory card adaptor may include a plurality of first terminals having a first arrangement and comprising a ground terminal, a plurality of second terminals having a second arrangement and electrically connected to the plurality of first terminals in a one-to-one correspondence, a ground frame that is electrically connected to the ground terminal and encompasses the plurality of first terminals and the plurality of second terminals, and a housing that accommodates the plurality of first terminals, the plurality of second terminals and the ground frame. The ground frame may extend along outer side surfaces of the housing. The ground frame may form a closed loop. The closed loop may include two closed sub-loops that share the ground terminal.

According to other aspects of the inventive concepts, a memory card adaptor may include first terminals, second terminals electrically connected to the first terminals in a one-to-one correspondence, a housing accommodating the first terminals and the second terminals, and a ground frame extending along side surfaces of the housing, and encompassing the first terminals and the second terminals. The ground frame may extend along an external side surface of the housing.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1A:
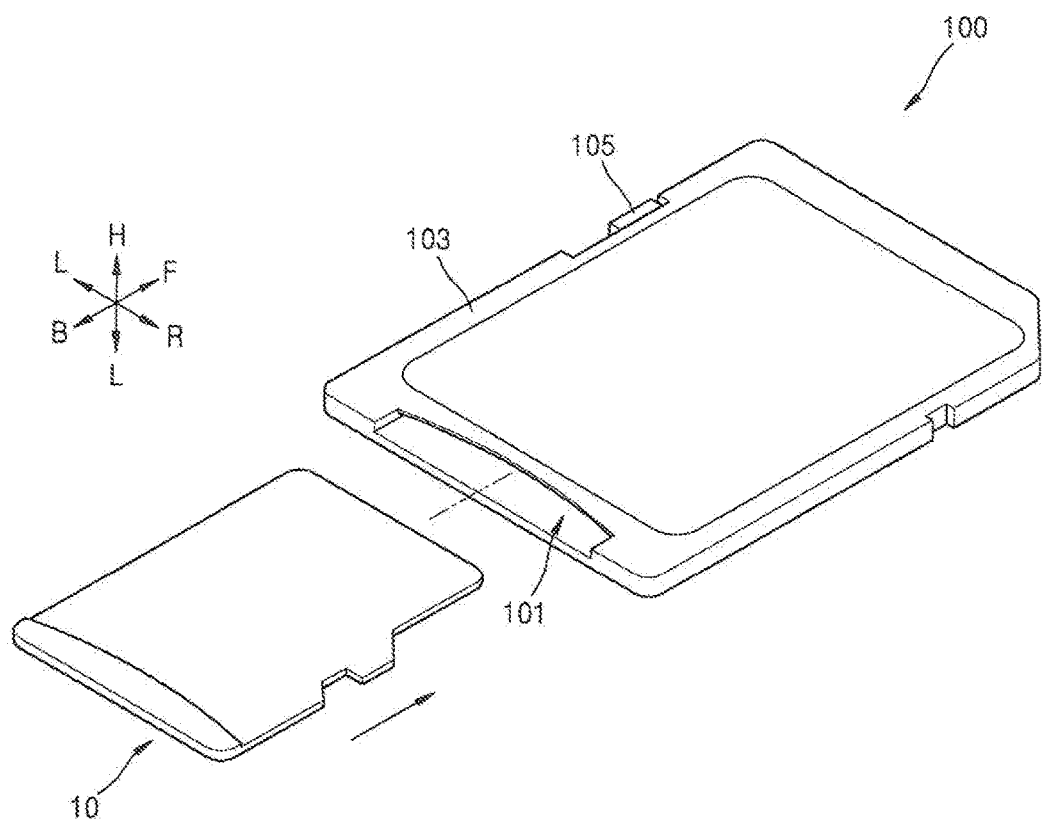
FIGS. 1A and 1B are perspective views of a front side and a rear side of a memory card adaptor, respectively, according to embodiments of the inventive concepts.

Hereinafter, the inventive concepts will be described more fully with reference to the accompanying drawings, in which example embodiments of the inventive concepts are shown. The embodiments of the inventive concepts may, however, be embodied in many different forms and should not be construed as limited to the example embodiments set forth herein. Rather, these embodiments are provided so that this disclosure will be thorough and complete, and will fully convey the scope of the inventive concepts to those skilled in the art. Like numbers refer to like elements throughout the specification. Various elements and regions illustrated in the drawings are schematic in nature. Thus, the inventive concepts are not limited to relative sizes or intervals illustrated in the accompanying drawings.

While such terms as "first," "second," etc., may be used to describe various components, such components must not be limited to the above terms. The above terms are used only to distinguish one component from another. For example, a first component discussed below could be termed a second component, and similarly, a second component may be termed a first component without departing from the teachings of this disclosure.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only, and is not intended to limit the inventive concepts. An expression used in the singular encompasses the expression in the plural, unless it has a clearly different meaning in the context. It will be understood that the terms "comprises" and/or "comprising," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which these inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The operations of all methods described herein can be performed in any suitable order unless otherwise indicated herein or otherwise clearly contradicted by context. The inventive concepts are not limited to the described order of the operations. For example, two consecutively described processes may be performed substantially at the same time or performed in an order opposite to the described order.

As such, variations from the shapes of the illustrations as a result, for example, of manufacturing techniques and/or tolerances, are to be expected. Thus, embodiments of the inventive concepts should not be construed as being limited to the particular shapes of regions illustrated herein but are to include deviations in shapes that result, for example, from manufacturing. As used herein, the term "and/or" includes any and all combinations of one or more of the associated listed items. The term "substrate" used in this specification may mean a substrate itself, or a stacked structure including a substrate and a layer or film formed on a surface of the substrate. The term "a surface of a substrate" used in this specification may mean an exposed surface of a substrate or an outer surface of a layer or film formed on the substrate.

Figure 1B:
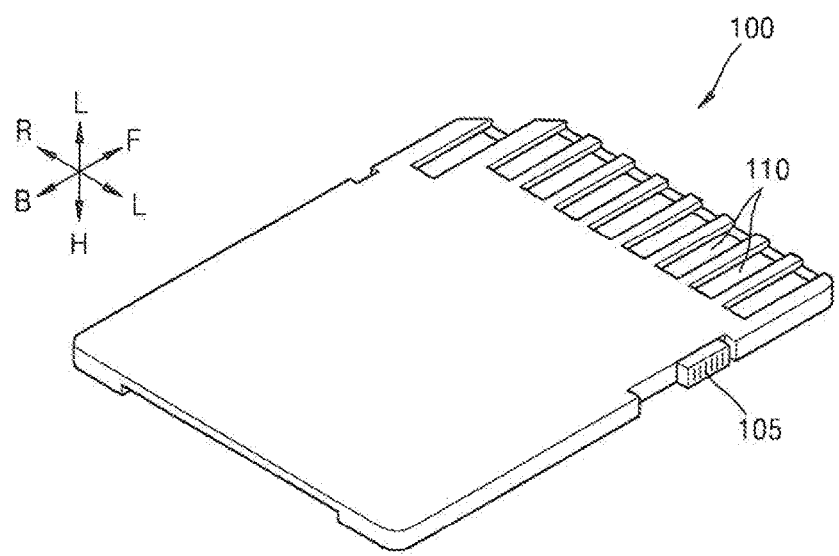
Figure 2A:
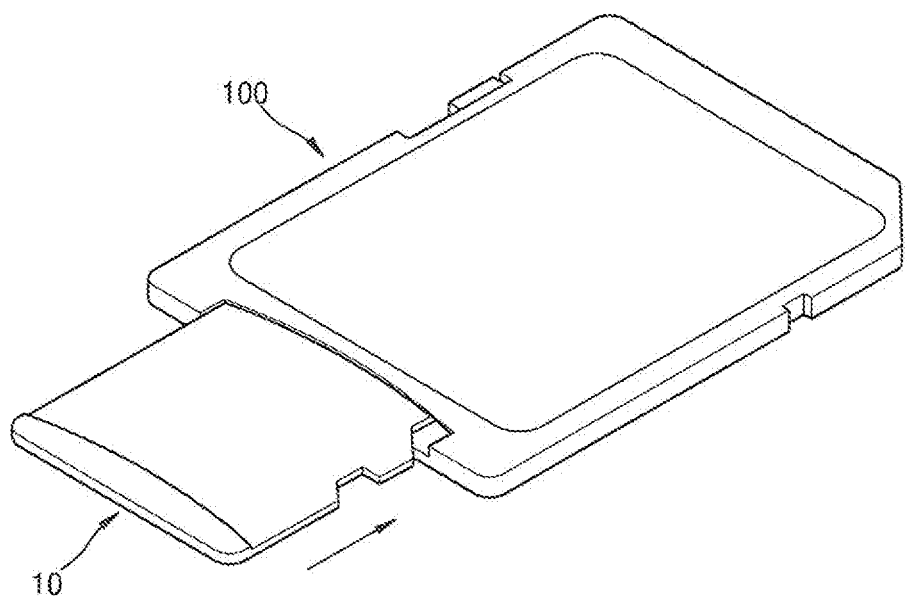
FIG. 2A shows insertion of a different type of memory card into the memory card adaptor of FIGS. 1A and 1B.

FIGS. 1A and 1B are perspective views of a front side and a rear side of a memory card adaptor 100, respectively, according to embodiments of the inventive concepts. FIG. 2A shows insertion of a different type of memory card 10 into the memory card adaptor 100, and FIG. 2B shows a state after the different type of memory card 10 is inserted into the memory card adaptor 100.

In FIGS. 1A and 1B, an HL direction indicates a vertical direction, an FB direction indicates a back and forth direction, and an LR direction indicates a horizontal direction. In particular, the FB direction may be an insertion and withdrawal direction of the different type of memory card 10.

Figure 2B:
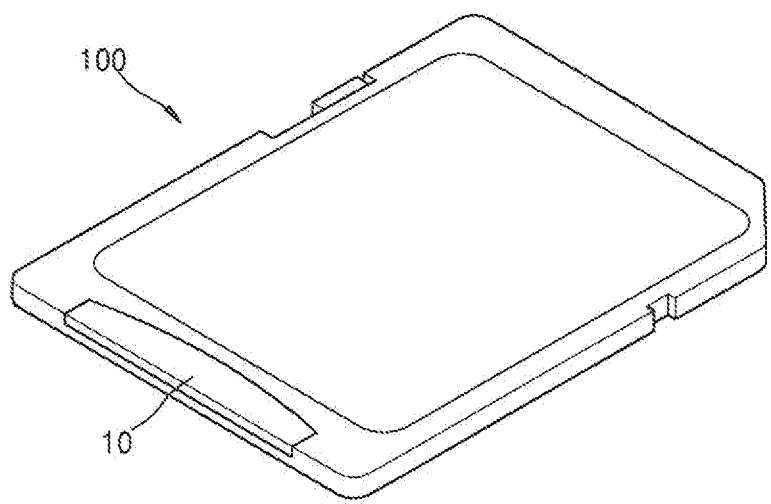
FIG. 2B shows a state after the different type of memory card is inserted into the memory card adaptor.

Referring to FIGS. 1A, 1B, 2A, and 2B, the memory card adaptor 100 may include an insertion portion 101 into which the different type of memory card 10 is inserted, a housing 103, socket-side terminals 110, and a write prevention knob 105. As shown in FIGS. 2A and 2B, the different type of memory card 10 may be inserted into the insertion portion 101 in the FB direction and then accommodated within the memory card adaptor 100.

By inserting the different type of memory card 10 into the memory card adaptor 100 as described above, data input/output between a host and the different type of memory card 10 may be performed via a socket that is provided in accordance with the size and the terminal arrangement of the memory card adaptor 100.

Although the socket-side terminals 110 of the memory card adaptor 100 are illustrated similar to a Secure Digital (SD) card in the present embodiment, this is only an example, and the inventive concepts are not limited thereto. Although the different type of memory card 10 is illustrated similar to a micro SD card in the present embodiment, this is only an example, and the inventive concepts are not limited thereto.

Figure 3:
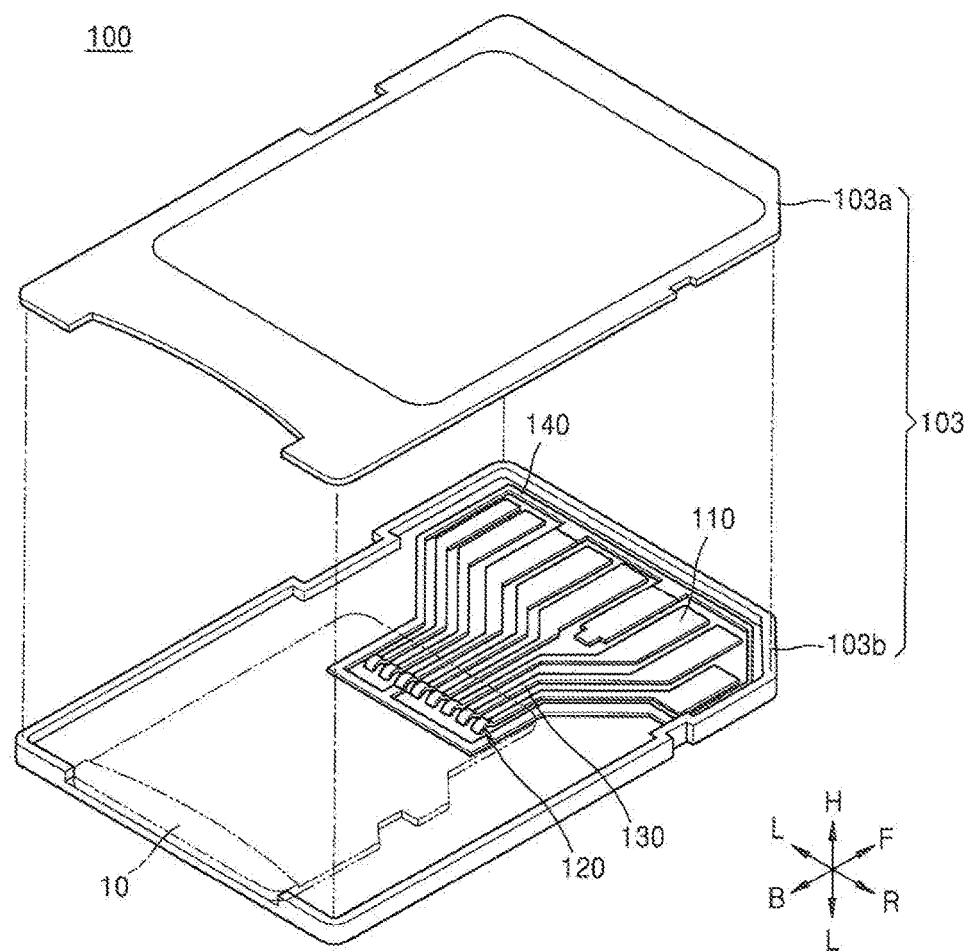
FIG. 3 is an exploded perspective view showing the inside of the memory card adaptor of FIGS. 1A and 1B by separating an upper housing and a lower housing of the memory card adaptor from each other.

FIG. 3 is an exploded perspective view showing the inside of the memory card adaptor 100 of FIGS. 1A and 1B by separating an upper housing 103a and a lower housing 103b of the memory card adaptor 100 from each other. FIG. 3 is a simplified view showing major components of the memory card adaptor 100.

Referring to FIG. 3, the housing 103 may accommodate a plurality of socket-side terminals 110 arranged in the RL direction which is a first direction, a plurality of card-side terminals 120 contacting terminals of the different type of memory card 10, wiring lines 130 electrically connecting the plurality of socket-side terminals 110 to the plurality of card-side terminals 120 corresponding thereto, respectively, and a ground frame 140.

The housing 103 may include the upper housing 103a and the lower housing 103b. The upper housing 103a and the lower housing 103b may be independently formed of, for example, thermoplastic resin, such as a polycarbonate, acrylonitrile butadiene styrene (ABS) resin, polybutylene terephthalate (PBT), polyethylene terephthalate (PET), polyphenylene ether (PPE), nylon, liquid crystal polymer (LCP), or a mixture thereof, in consideration of, for example, reduced weight, ease of processing, and flexibility.

Although the upper housing 103a and the lower housing 103b may be integrally formed with each other in FIG. 3, in some embodiments the upper housing 103a and the lower housing 103b may be independent blocks.

Surfaces of the plurality of socket-side terminals 110 at one side of the housing 103 may be exposed to the outside, as shown in FIGS. 1A and 1B. The exposed surfaces of the plurality of socket-side terminals 110 may contact the terminals of a socket, when the memory card adaptor 100 has been inserted into the socket.

The plurality of card-side terminals 120 may be configured to contact the terminals formed on a lower surface of the different type of memory card 10 when the different type of memory card 10 has been inserted into the memory card adaptor 100. According to example embodiments of the inventive concepts, center portions of the plurality of card-side terminals 120 may be bent upward as shown in FIG. 3.

The plurality of socket-side terminals 110 may be electrically connected to the plurality of card-side terminals 120 corresponding thereto, respectively, via the wiring lines 130.

A socket-side terminal 110, a wiring line 130, and a card-side terminal 120 corresponding to one another may be integrally formed with one another or may be independent components that are electrically connected. The socket-side terminals 110, the wiring lines 130 and the card-side terminals 120 may be formed of an electroconductive material, but embodiments of the inventive concepts are not limited thereto. For example, the socket-side terminals 110, the wiring lines 130, and the card-side terminals 120 may be formed of metal. According to some embodiments, the plurality of socket-side terminals 110, the wiring lines 130, and the plurality of card-side terminals 120 may be formed of copper (Cu), aluminum (Al), nickel (Ni), iron (Fe), gold (Au), silver (Ag), platinum (Pt), zinc (Zn), tin (Sn), titanium (Ti), an alloy of these materials, a coating of these materials, or a mixture thereof.

The memory card adaptor 100 may further include the ground frame 140. The ground frame 140 may be electrically connected to ground terminals of the plurality of socket-side terminals 110 and/or those of the plurality of card-side terminals 120. The ground frame 140 may be formed of an electroconductive material, and this will be described later in more detail.

The size of the memory card adaptor 100 is not particularly restricted. For example, the memory card adaptor 100 may have a size of an SD card in which external measurements are 32 mm and 24 mm and a thickness is 2.1 mm, a size of a miniSD card in which external measurements are 20 mm and 21.5 mm and a thickness is 1.4 mm, a size of a microSD card in which external measurements are 11 mm and 15 mm and a thickness is 1 mm, a size of a multimedia card (MMC) in which external measurements are 32 mm and 24 mm and a thickness is 1.4 mm, or a size of a reduced size multimedia card (RSMMC) in which external measurements are 18 mm and 24 mm and a thickness is 1.4 mm. However, the inventive concepts are not limited to these sizes.

The size of a card 10 that may be inserted into the insertion portion 101 of the memory card adaptor 100 may be determined to be smaller than that of the memory card adaptor 100. For example, a card 10 that may be inserted into the insertion portion 101 of the memory card adaptor 100 may have a size of a Universal Serial Bus (USB) card, a size of a Universal Flash Storage (UFS) card, a size of an SD card in which external measurements are 32 mm and 24 mm and a thickness is 2.1 mm, a size of a miniSD card in which external measurements are 20 mm and 21.5 mm and a thickness is 1.4 mm, a size of a microSD card in which external measurements are 11 and 15 mm and a thickness is 1 mm, a size of an MMC in which external measurements are 32 mm and 24 mm and a thickness is 1.4 mm, or a size of an RSMMC in which external measurements are 18 mm and 24 mm and a thickness is 1.4 mm. However, the inventive concepts are not limited to these sizes.

The plurality of socket-side terminals 110, the plurality of card-side terminals 120, the wiring lines 130, and the ground frame 140 will now be described in more detail.

Figure 4:
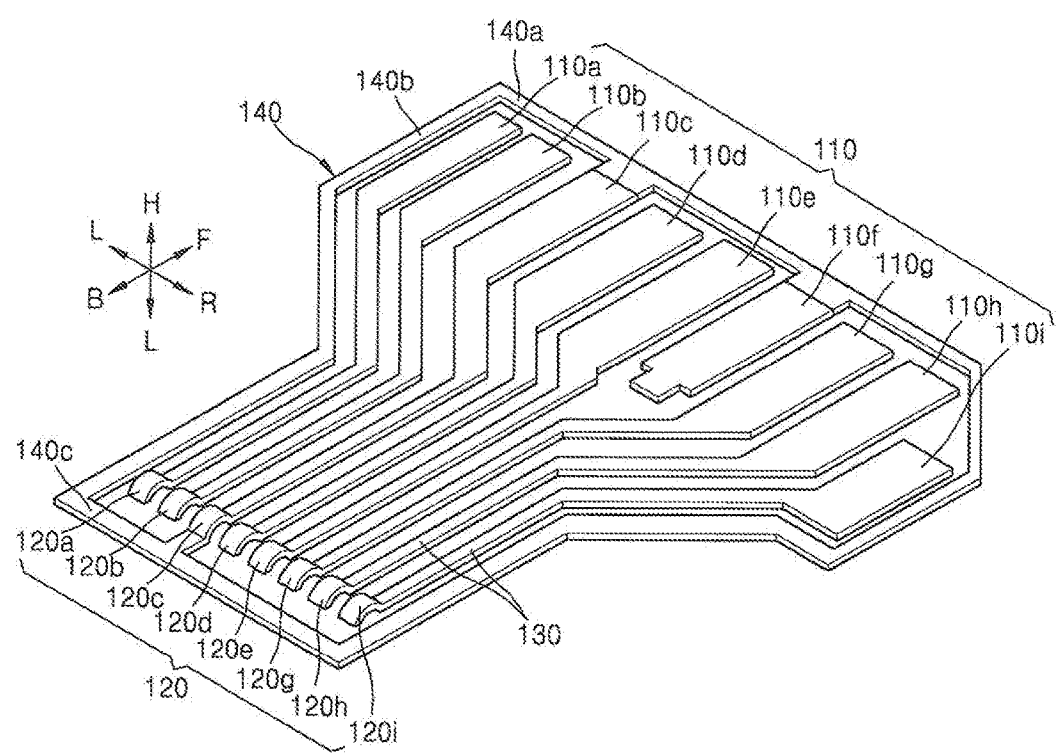
FIG. 4 is a perspective view showing a plurality of socket-side terminals, a plurality of card-side terminals, wiring lines, and a ground frame included in the memory card adaptor of FIGS. 1A and 1B.

FIG. 4 is a perspective view showing the plurality of socket-side terminals 110, the plurality of card-side terminals 120, the wiring lines 130, and the ground frame 140. The perspective view of FIG. 4 shows major components from among the components included in the memory card adaptor 100 of FIG. 3.

Referring to FIG. 4, the plurality of socket-side terminals 110 may be arranged in the first direction (RL direction in FIG. 4). Although nine socket-side terminals 110 (110a through 110i) are illustrated in FIG. 4, the number of socket-side terminals 110 may be less than or greater than nine.

The plurality of socket-side terminals 110 may include at least one ground terminal. According to example embodiments of the inventive concepts, the plurality of socket-side terminals 110 may include two ground terminals.

According to example embodiments of the inventive concepts, the plurality of socket-side terminals 110 may include a DAT1 terminal 110a, a DAT0 terminal 110b, a DAT3 terminal 110h and a DAT4 terminal 110i which are data terminals, a VSS2 terminal 110c and a VSS1 terminal 110f which are ground terminals, a CLK terminal 110d which is a clock terminal, a voltage (VDD) terminal 110e which is a power terminal, and a CMD terminal 110g which is a command terminal.

The VSS2 terminal 110c and the VSS1 terminal 110f, which are ground terminals, from among the plurality of socket-side terminals 110 may be electrically connected to each other via the ground frame 140. However, the ground frame 140 may directly contact neither of the data terminals, the clock terminal, the power terminal, nor the command terminal. Furthermore, the ground frame 140 may indirectly contact neither of the data terminals, the clock terminal, the power terminal, nor the command terminal.

The ground frame 140 may include a first ground sub-frame 140a connecting the VSS2 terminal 110c and the VSS1 terminal 110f, which are ground terminals, to each other, and then extending over sides of the VSS2 terminal 110c and the VSS1 terminal 110f. In other words, the first ground sub-frame 140a may extend in the first direction and connect the VSS2 terminal 110c to the VSS1 terminal 110f. The first ground sub-frame 140a may further extend to face front end side surfaces of other terminals adjacent to the sides of the VSS2 terminal 110e and the VSS1 terminal 110f, for example, the DAT0 terminal 110b, the DAT1 terminal 110a, the CMD terminal 110g, the DAT3 terminal 110h, and/or the DAT4 terminal 110i.

The first ground sub-frame 140a may extend to overlap with the front end side surfaces of the plurality of socket-side terminals 110, as viewed in the HL direction. In this case, the first ground sub-frame 140a may include portions that extend in a direction other than the first direction.

In some embodiments, the first ground sub-frame 140a may be electrically connected Co only one of the VSS2 terminal 110c and the VSS1 terminal 110f, which are ground terminals.

According to example embodiments of the inventive concepts, the ground frame 140 may at least partially meet with a plane that is formed by main surfaces of the plurality of socket-side terminals 110. In other words, a plane that is formed by upper surfaces of the plurality of socket-side terminals 110, or a plane that is formed by lower surfaces thereof may at least partially meet with the ground frame 140.

The ground frame 140 may further include a second ground sub-frame 140b that is connected with the first ground sub-frame 140a and extends in a second direction (FB direction). According to example embodiments of the inventive concepts, the first ground sub-frame 140a and the second ground sub-frame 140b may be integrally formed with each other. The second direction may be a direction that is substantially perpendicular to the first direction.

The plurality of card-side terminals 120 may be electrically connected to the plurality of socket-side terminals 110 in a one-to-one correspondence. According to example embodiments of the inventive concepts, the plurality of socket-side terminals 110 may include two ground terminals 110c and 110f, and the plurality of card-side terminals 120 may include a single ground terminal 120c. Since the plurality of socket-side terminals 110 can include the two ground terminals 110c and 110f, and the plurality of card-side terminals 120 can include the single ground terminal 120c, the ground terminal 110f may not be electrically connected to the plurality of card-side terminals 120 by using the wiring lines 130. However, the inventive concepts are not limited to this terminal configuration.

Data (DAT) terminals 120a, 120b, 120h, and 120i of the plurality of card-side terminals 120 may be electrically connected to the data terminals 110a, 110b, 110h, and 110i of the plurality of socket-side terminals 110 via wiring lines 130. A command (CMD) terminal 120g, a VDD terminal 120e, and a clock (CLK) terminal 120d of the plurality of card-side terminals 120 may be electrically connected to the CMD terminal 110g, the VDD terminal 110e, and the CLK terminal 110d of the plurality of socket-side terminals 110, respectively, via wiring lines 130.

The ground frame 140 may further include a third ground sub-frame 140c. The third ground sub-frame 140c may be arranged near the plurality of card-side terminals 120. According to example embodiments of the inventive concepts, the third ground sub-frame 140c may be electrically connected to the ground terminal 120c. According to example embodiments of the inventive concepts, the third ground sub-frame 140c may be electrically connected to the card-side ground terminal 120c, while not being directly connected to the socket-side ground terminals 110e and 110f. According to example embodiments of the inventive concepts, the third ground sub-frame 140c may extend in the first direction (RL direction).

The ground frame 140 may surround the side surfaces of the plurality of socket-side terminals 110, the plurality of card-side terminals 120, and the wiring lines 130. According to example embodiments of the inventive concepts, the ground frame 140 may form a closed loop.

As shown in FIG. 4, the socket-side ground terminal 110c may be connected to the first ground sub-frame 140a, the card-side ground terminal 120c may be connected to the third ground sub-frame 140c, and the socket-side ground terminal 110c and the card-side ground terminal 120c may be connected to each other via a wiring line 130. In this case, the closed loop may include two closed sub-loops that share the card-side ground terminal 120c.

Figure 5:
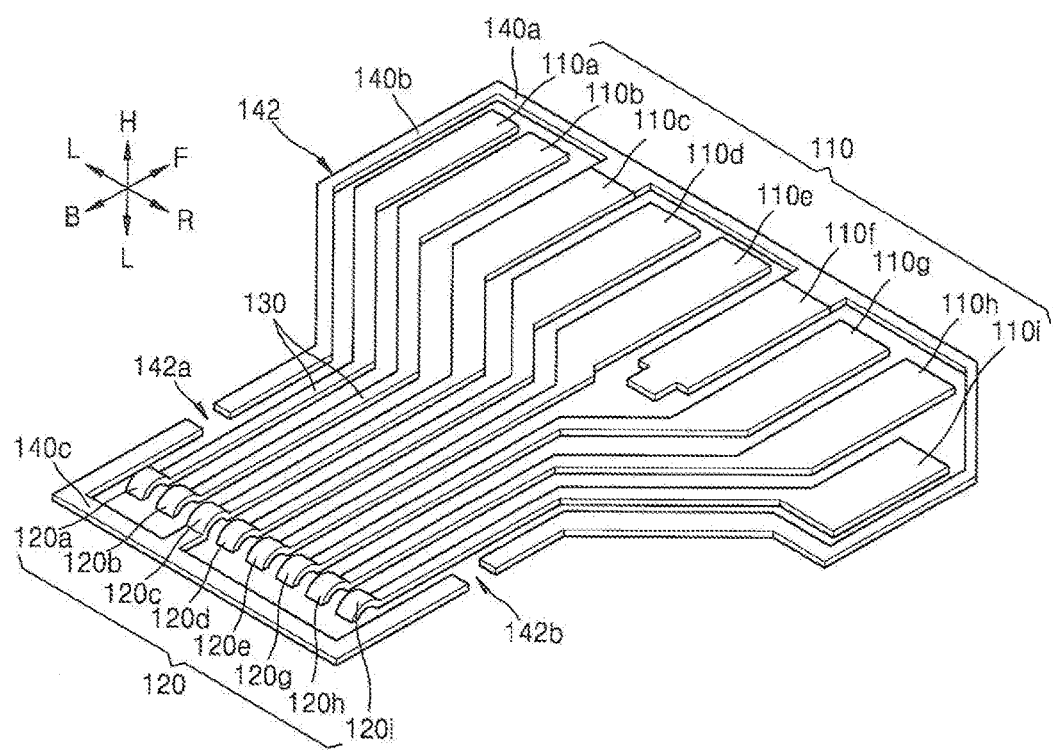
FIG. 5 is a perspective view showing a plurality of socket-side terminals, a plurality of card-side terminals, wiring lines, and a ground frame included in a memory card adaptor according to some embodiments of the inventive concepts.

FIG. 5 is a perspective view showing the plurality of socket-side terminals 110, the plurality of card-side terminals 120, the wiring lines 130, and a ground frame 142, according to some embodiments of the inventive concepts.

Referring to FIG. 5, the ground frame 142 may surround the side surfaces of the plurality of socket-side terminals 110, the plurality of card-side terminals 120, and the wiring lines 130, but may not form a closed loop. In other words, as shown in FIG. 5, the ground frame 142 may include discontinuities 142a and 142b. Although the two discontinuities 142a and 142b exist in the ground frame 142 in FIG. 5, only one discontinuity may exist, or more than two discontinuities may exist.

Due to the provision of the discontinuities 142a and 142b to the ground frame 142, structures for fixing the wiring lines 130 within the housing 103 (see FIG. 1A) may be more freely constructed.

Matters other than the above-described matters are the same as those described with reference to FIG. 4, and thus repeated descriptions thereof will be omitted here.

Figure 6:
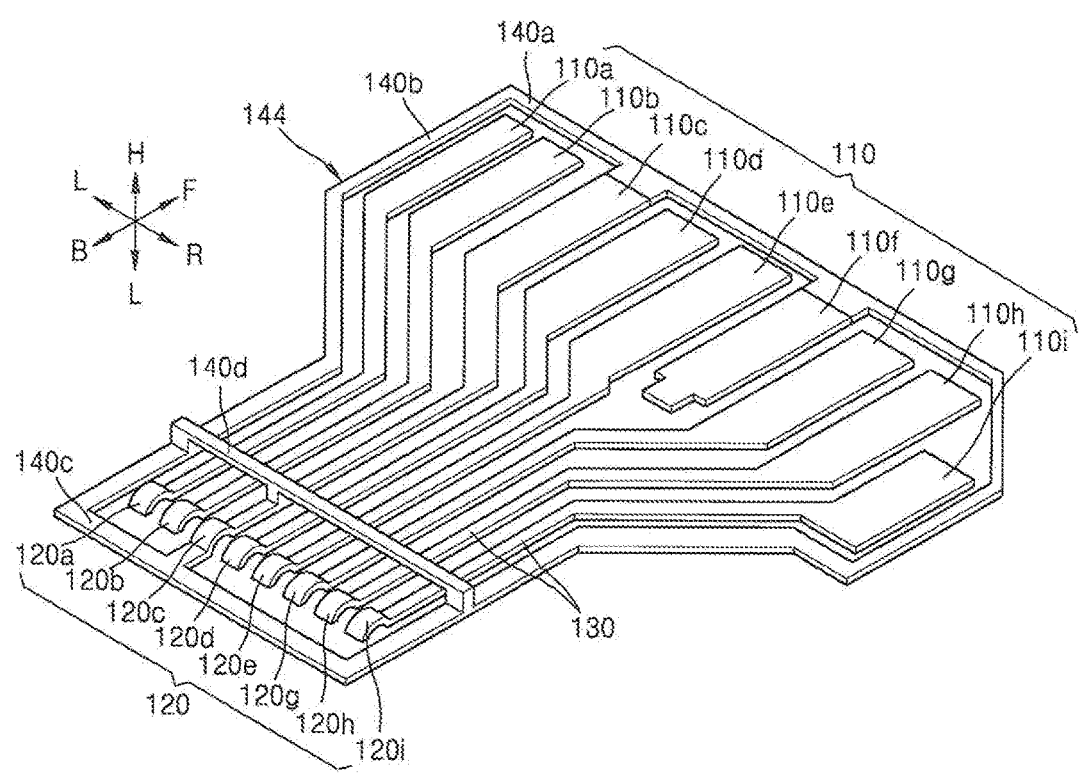
FIG. 6 is a perspective view showing a plurality of socket-side terminals, a plurality of card-side terminals, wiring lines, and a ground frame included in a memory card adaptor according to some embodiments of the inventive concepts.

FIG. 6 is a perspective view showing the plurality of socket-side terminals 110, the plurality of card-side terminals 120, the wiring lines 130, and a ground frame 144, according to some embodiments of the inventive concepts.

Referring to FIG. 6, the ground frame 144 may further include a fourth ground sub-frame 140d. The fourth ground sub-frame 140d may be spaced apart from the wiring lines 130 and extend over the wiring lines 130. According to example embodiments of the inventive concepts, the fourth ground sub-frame 140d may be disposed over the wiring lines 130 to be spaced apart from the wiring lines 130, and extend in the first direction (RL direction).

According to example embodiments of the inventive concepts, the fourth ground sub-frame 140d may be connected to a wiring line 130 that is connected to the socket-side ground terminal 110c. According to example embodiments of the inventive concepts, both ends of the fourth ground sub-frame 140d may be connected to an external portion of the ground frame 144 that surrounds the wiring lines 130.

According to example embodiments of the inventive concepts, the fourth ground sub-frame 140d may be spaced apart from the wiring lines 130 and extend over the wiring lines 130. In some embodiments, the fourth ground sub-frame 140d may be spaced apart from the wiring lines 130 and extend over some of the wiring lines 130.

Figure 7:
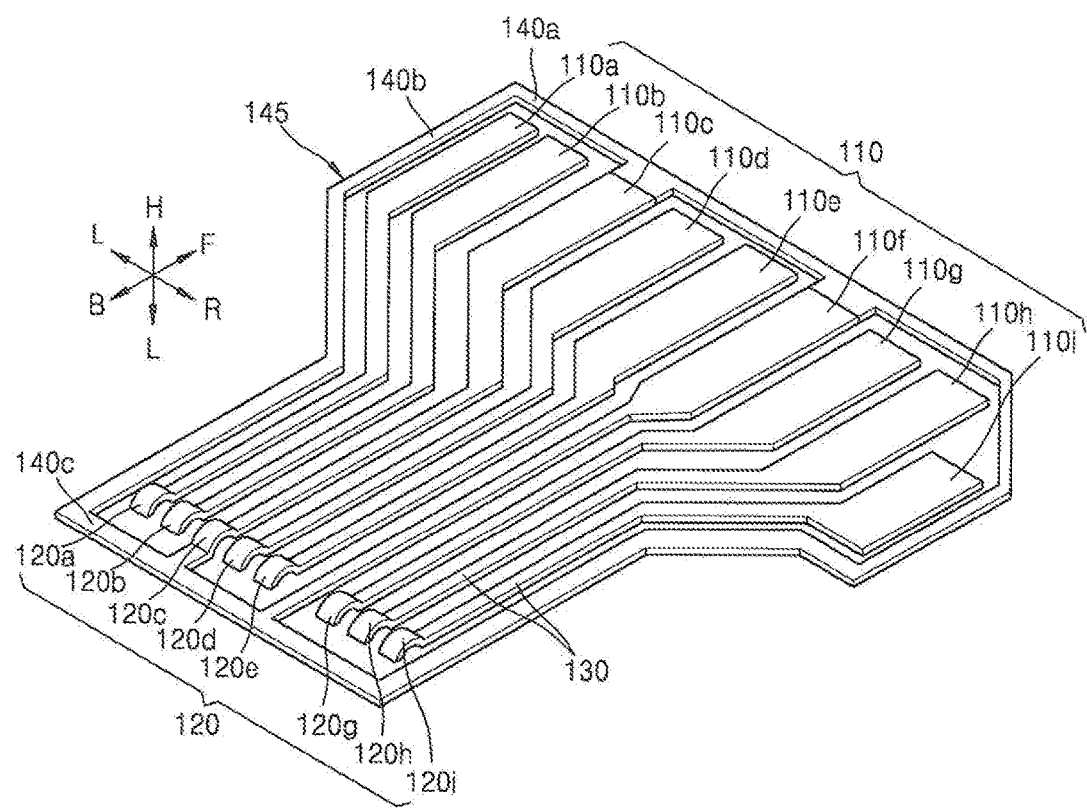
FIG. 7 is a perspective view showing a plurality of socket-side terminals, a plurality of card-side terminals, wiring lines, and a ground frame included in a memory card adaptor according to some embodiments of the inventive concepts.

FIG. 7 is a perspective view showing the plurality of socket-side terminals 110, the plurality of card-side terminals 120, the wiring lines 130, and a ground frame 145, according to some embodiments of the inventive concepts.

Referring to FIG. 7, the ground frame 145 includes a first ground sub-frame 140a, a second ground sub-frame 140b, and a third ground sub-frame 140c. As shown in FIG. 4, a socket-side ground terminal 110c may be directly connected to the first ground sub-frame 140a. A wiring line 130 connected to the socket-side ground terminal 110c may be connected to a card-side ground terminal 120c. The card-side ground terminal 120c may be directly connected to the third ground sub-frame 140c.

A socket-side ground terminal 110f may be directly connected to the first ground sub-frame 140a. A wiring line 130 connected to the socket-side ground terminal 110f may be directly connected to the third ground sub-frame 140c.

The ground frame 145 may include a ground line that forms a closed loop defining an outermost perimeter of the ground frame 145, and further include two ground lines extending in the second direction (FB direction) while separating the plurality of socket-side terminals 110 from the plurality of card-side terminals 120. By constructing the ground frame 145 in this way, various closed sub-loops that share the card-side ground terminal 120c and/or the socket-side ground terminals 110c and 110f may be constructed. Since the ground frame 145 is able to more securely shield data terminals, better electrical characteristics may be achieved.

Figure 8:
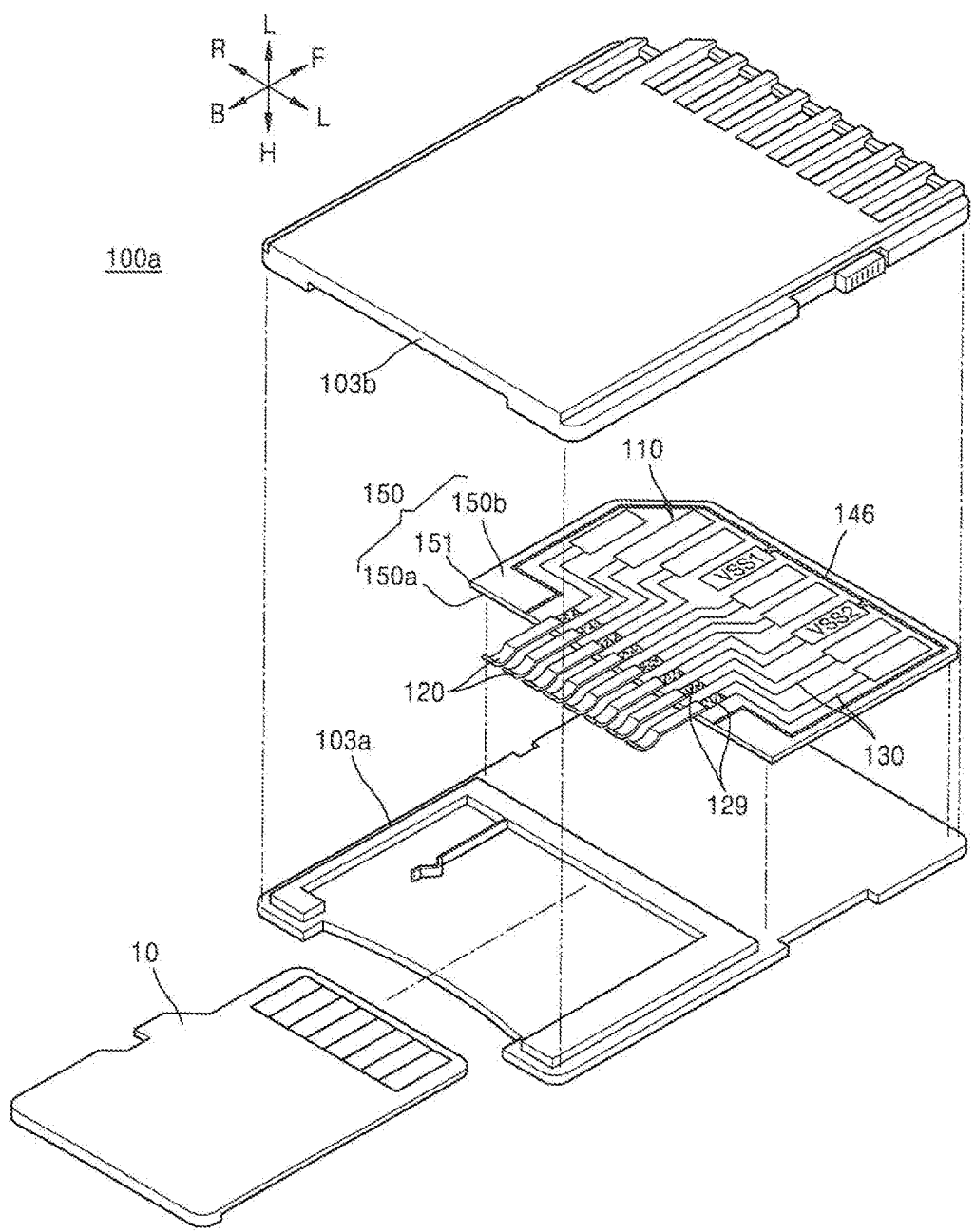
FIG. 8 is an exploded perspective view of a memory card adaptor according to some embodiments of the inventive concepts.

FIG. 8 is an exploded perspective view of a memory card adaptor 100a according to some embodiments of the inventive concepts.

Referring to FIG. 8, at least portions of the plurality of socket-side terminals 110, the plurality of card-side terminals 120, the wiring lines 130, and a ground frame 146 may be provided on a printed circuit board (PCB) 150.

In more detail, the PCB 150 may electrically connect the different type of memory card 10 to an external socket that has different specifications from the different type of memory card 10. The PCB 150 includes a core 151 having an upper surface and a lower surface, a first layer 150a formed on the upper surface of the core 151, and a second layer 150b formed on the lower surface of the core 151.

The core 151 may include an insulation material. For example, the core 151 may be manufactured of glass epoxy. However, the inventive concepts are not limited thereto.

The first layer 150a and/or the second layer 150b may include contact lands 129 to which the plurality of card-side terminals 120 may be coupled. The contact lands 129 may be electrically connected to the plurality of socket-side terminals 110 in a one-to-one correspondence, via the wiring lines 130. Although the wiring lines 130 may be formed on the second layer 150b in FIG. 8, some of the wiring lines 130 may be formed on the first layer 150a. In particular, each of the wiring lines 130 may have various shapes in order to adjust a skew of a signal/data.

The second layer 150b may include the plurality of socket-side terminals 110 that contact the terminals of a socket. Although the plurality of socket-side terminals 110 may include two ground terminals VSS1 and VSS2 in FIG. 8, embodiments of the inventive concepts are not limited thereto.

The second layer 150b may also include the ground frame 146, which may extend to surround the plurality of socket-side terminals 110, the wiring lines 130, and the contact lands 129 while being connected to the ground terminals VSS1 and VSS2. However, in some embodiments of the inventive concepts, the ground frame 146 may include a discontinuity.

According to example embodiments of the inventive concepts, a first portion of the ground frame 146 may be formed on the first layer 150a, a second portion of the ground frame 146 may be formed on the second layer 150b, and the two portions may be connected to each other through a via that penetrates through the PCB 150, thereby constructing the ground frame 146 having a closed loop shape that surrounds the plurality of socket-side terminals 110, the wiring lines 130, and the contact lands 129.

According to example embodiments of the inventive concepts, some of the wiring lines 130 and the plurality of socket-side terminals 110 may be formed on the second layer 150b, and some of the wiring lines 130 and the plurality of card-side terminals 120 may be formed on the first layer 150a. In this case, the wiring lines 130 formed on the second layer 150b and the wiring lines 130 formed on the first layer 150a may be connected to each other through the via that penetrates through the PCB 150. The construction of the ground frame 146 in this way facilitates forming the ground frame 146 on the second layer 150b in the form of a closed loop.

In some embodiments of the inventive concepts, at least a portion of the ground frame 146 may extend along the side surface of the PCB 150.

Figure 9:
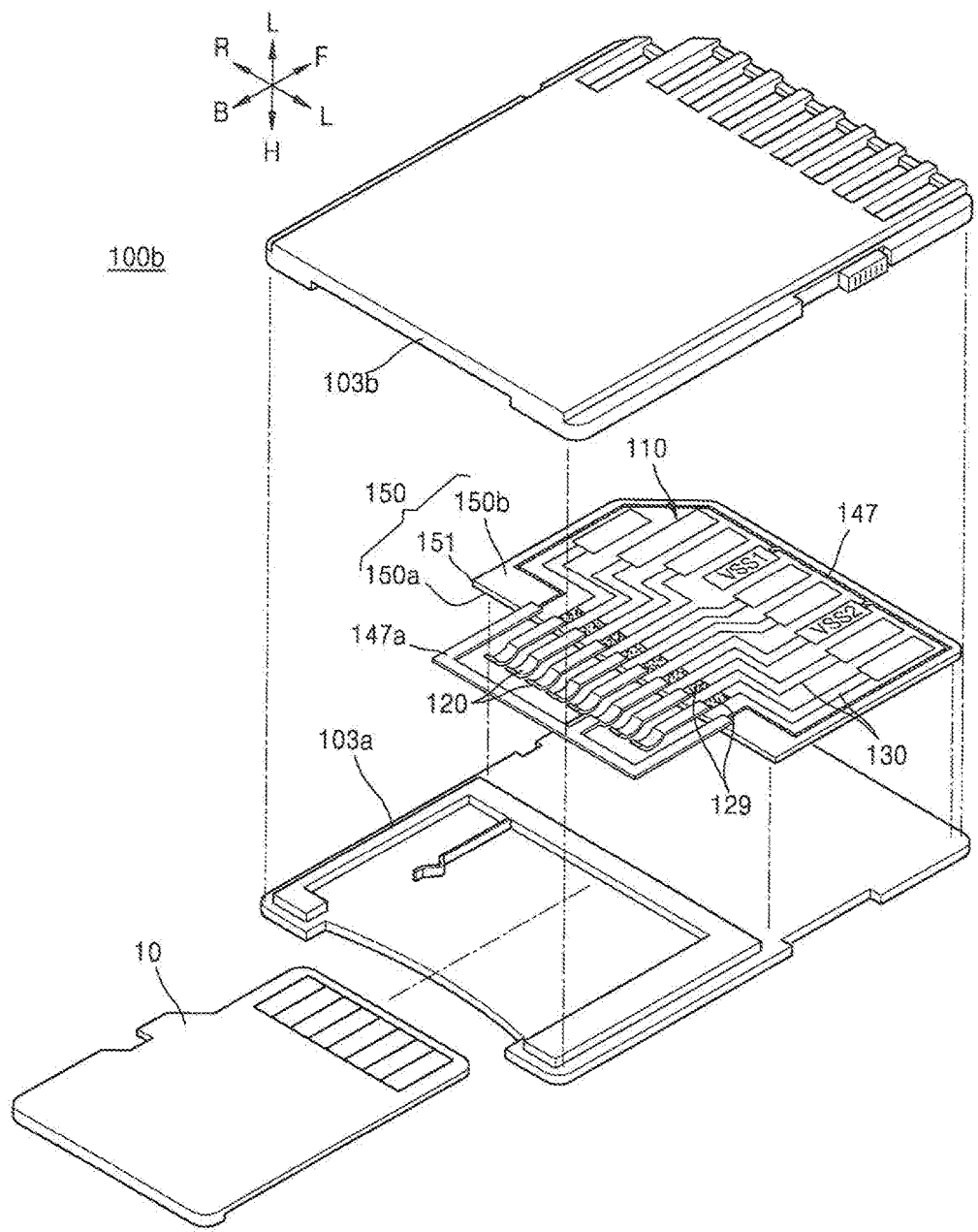
FIG. 9 is an exploded perspective view of memory card adaptor according to some embodiments of the inventive concepts.

FIG. 9 is an exploded perspective view of a memory card adaptor 100b according to some embodiments of the inventive concepts.

In the memory card adaptor 100b of FIG. 9, a ground frame 147 may extend such that the ground frame 147 is electrically connected to socket-side ground terminals VSS1 and VSS2, and then the ground frame 147 may surround the plurality of socket-side terminals 110, the wiring lines 130, and the contact lands 129. The ground frame 147 may further include an extended ground sub-frame 147a that protrudes and extends to the outside of the PCB 150.

The extended ground sub-frame 147a may be an electric conductor that may extend to the outside of the PCB 150 while directly contacting or being electrically connected to a portion of the ground frame 147 that extends up to an edge of the PCB 150.

The extended ground sub-frame 147a may be electrically connected to the socket-side ground terminal VSS2. In other words, the extended ground sub-frame 147a may be electrically connected to the socket-side ground terminal VSS2 via one of the card-side ground terminals 120 and a wiring line 130. The extended ground sub-frame 147a may also be electrically connected to the socket-side ground terminal VSS2 via a portion of the ground frame 147 that extends to surround the plurality of socket-side terminals 110, the wiring lines 130, and the contact lands 129.

Matters other than the above-described matters are the same as those of the memory card adaptor 100a described above with reference to FIG. 8, and thus repeated descriptions thereof will be omitted herein.

Figure 10:
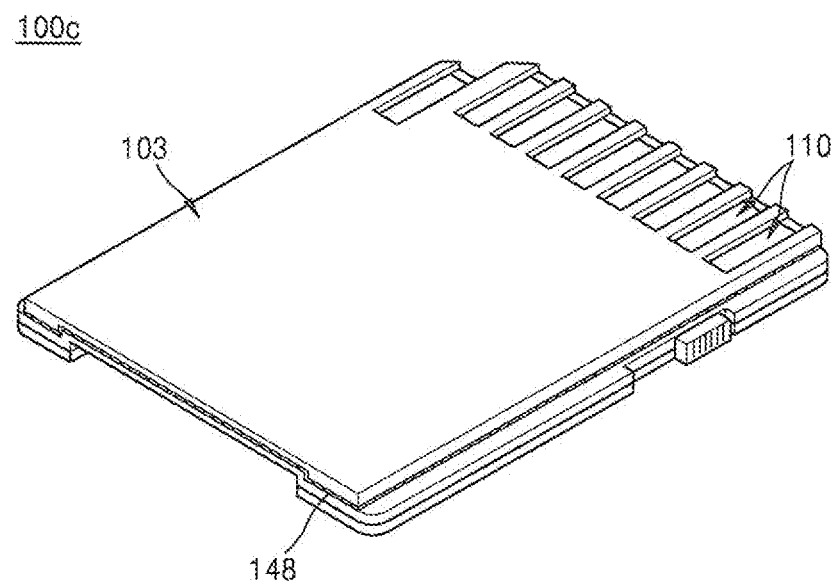
FIG. 10 is a perspective view of a memory card adaptor according to some embodiments of the inventive concepts.

FIG. 10 is a perspective view of a memory card adaptor 100c according to some embodiments of the inventive concepts.

Referring to FIG. 10, the plurality of socket-side terminals 110 may be exposed via an aperture of the housing 103, and, in particular, the ground terminal 110c may be electrically connected to a ground frame 148 formed along an external side surface of the housing 103. In more detail, the ground frame 148 may extend along an external side surface of a front end of the memory card adaptor 100c which is first inserted into a socket. In this case, the ground frame 148 may be connected to the ground terminal 110c. The ground frame 148 may extend along left and right side surfaces of the memory card adaptor 100c, in the second direction (FB direction). The ground frame 148 may also extend along a rear surface of the memory card adaptor 100c to thereby form a closed loop.

According to the embodiments of FIGS. 3-10, the ground frames 140, 142, 144, 146, and 148 may provide electromagnetic shielding while substantially surrounding the plurality of socket-side terminals 110, the plurality of card-side terminals 120, and the wiring lines 130. Consequently, electric characteristics may be greatly improved, and thus loss during data input/output may be greatly reduced.

Although the features and effects of the inventive concepts will now be described in more detail with reference to example embodiments and comparative examples, these example embodiments are intended to convey the inventive concepts, and not limit the inventive concepts.

EXAMPLE 1

A ground frame as shown in FIG. 4 was modeled, and then an HFSS numerical simulation was performed via a finite-element method. An input frequency was gradually increased, and then a frequency that shows data loss of −3 dB was set as an evaluation index.

COMPARATIVE EXAMPLE 1

A ground frame that exists between only two socket-side ground terminals of FIG. 4 and not extends to the outside of the two socket-side ground terminals was modeled, and then an HFSS numerical simulation was performed using the same method as that used in Example 1. An input frequency was gradually increased, and then a frequency that shows data loss of −3 dB was set as an evaluation index.

Consequently, in Comparative Example 1, loss of −3 dB was generated at just 344.0 MHz in a DAT2 terminal, whereas, in Example 1, loss of −3 dB was generated at 1.24 GHz in DAT3 terminal. Thus, when a ground frame is constructed as in Example 1, electric characteristics may be greatly improved, compared with when a ground frame is constructed as in Comparative Example 1. In other words, good and stable data transmission is possible even at an interface that operates at a high speed.

Figure 11:
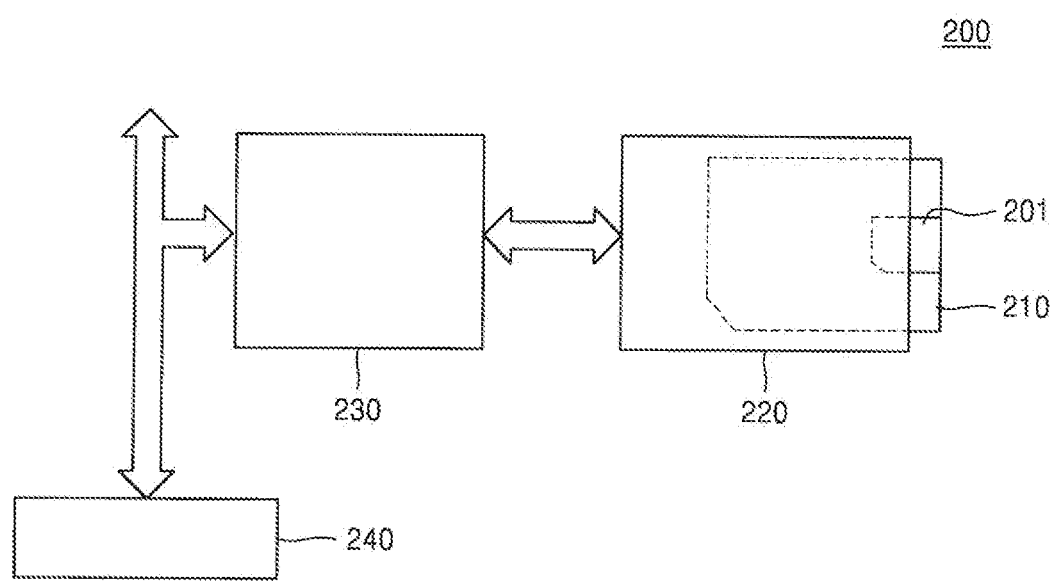
FIG. 11 is a schematic view illustrating a system that uses a memory card adaptor, according to embodiments of the inventive concepts.

FIG. 11 is a schematic view illustrating a system 200 that uses a memory card adaptor 210 according to embodiments of the inventive concepts.

Referring to FIG. 11, the system 200 includes a socket 220, a memory card adaptor 210 described above with reference to the previous embodiments, a different type of memory card 201 accommodated in the memory card adaptor 210, a card interface controller 230, and a host or an external device 240. The socket 220 may be insertable and contact the memory card adaptor 210. The socket 220 may be configured to be electrically connected to the plurality of socket-side terminals 110 of the memory card adaptor 210 illustrated in FIGS. 3-10. The card interface controller 230 may control data exchange with the different type of memory card 201 within the memory card adaptor 210, via the socket 220. The card interface controller 230 may be used to store data in the different type of memory card 201 within the memory card adaptor 210. The host 240 may control the card interface controller 230.

Figure 12:
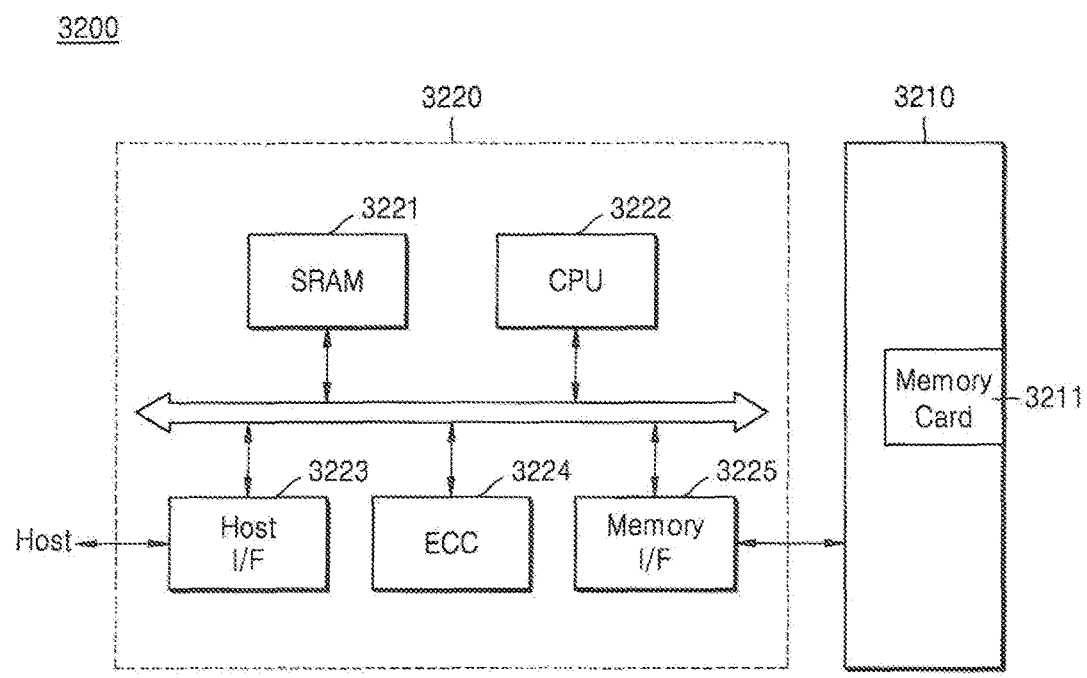
FIG. 12 is a block diagram illustrating a memory device including a memory card adaptor according to some embodiments of the inventive concepts.

FIG. 12 is a block diagram illustrating a memory device 3200 including a memory card adaptor 3210, according to the inventive concepts.

Referring to FIG. 12, the memory device 3200 may include the memory card adaptor 3210 and a memory card 3211 accommodated within the memory card adaptor 3210. The memory card adaptor 3210 may include at least one of the memory card adaptors according to the above-described embodiments of the inventive concepts. The memory card 3211 within the memory card adaptor 3210 may include a semiconductor memory device in any of various forms (for example, a non-volatile memory device and/or a static random access memory (SRAM) device). The memory device 3200 may include a memory controller 3220 that controls data exchange between a host and the memory card 3211.

The memory controller 3220 may include a central processing unit (CPU) 3222 that controls an overall operation of the memory device 3200. The memory controller 3220 may also include an SRAM 3221 that is used as an operation memory of the CPU 3222. In addition, the memory controller 3220 may further include a host interface 3223 and a memory interface (PP) 3225. The host I/F 3223 may include a data exchange protocol between the memory device 3200 and the host. The memory interface 3225 may connect the memory controller 3220 and the memory card adaptor 3210. Furthermore, the memory controller 3220 may further include an error correction code (ECC) block 3224. The FCC block 3224 may detect and correct an error of data read from the memory card 3211. Although not illustrated, the memory device 3200 may farther include a read only memory (ROM) device that stores code data for interfacing with the host. The memory device 3200 may also be implemented by using a solid state drive (SSD) which may replace a hard disk of a computer system.

Figure 13:
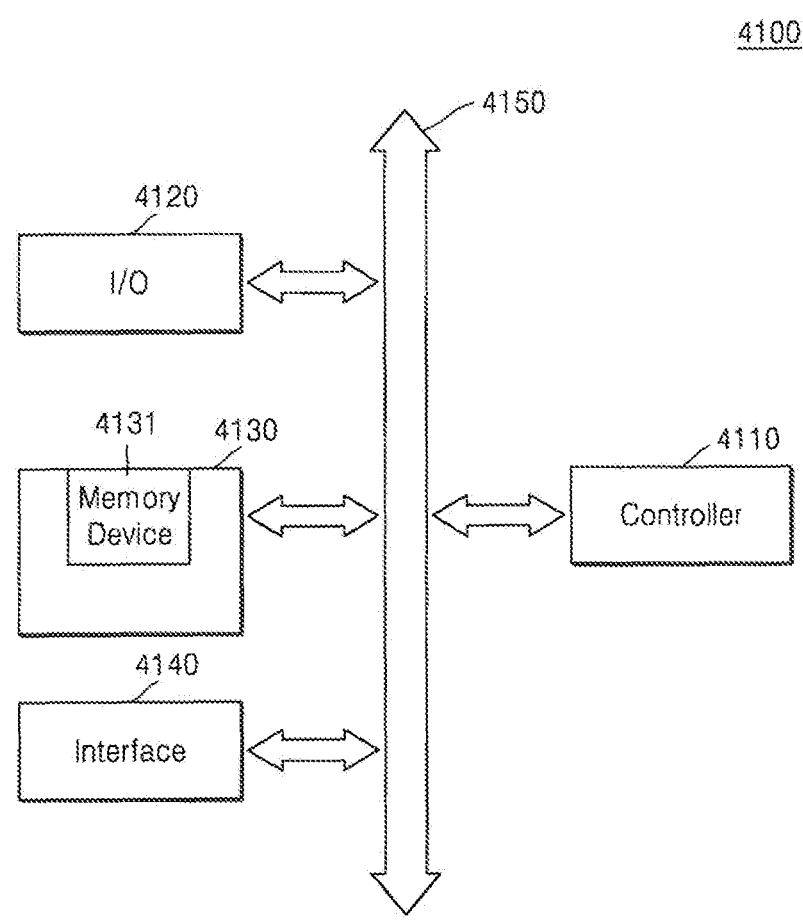
FIG. 13 is a block diagram illustrating an electronic system including a memory card adaptor according to embodiments of the inventive concepts.

FIG. 13 is a block diagram illustrating an electronic system 4100 including a memory card adaptor 4130 according to embodiments of the inventive concepts.

Referring to FIG. 13, the electronic system 4100 may include a controller 4110, an input/output (I/O) device 4120, a memory device adaptor 4130, an interface 4140, and a bus 4150. The memory device adaptor 4130 may accommodate a memory device 4131 that follows a different standard. The controller 4110, the I/O device 4120, the memory device adaptor 4130, and/or the interface 4140 may be coupled to one another via the bus 4150. The bus 4150 corresponds to a path through which data is transmitted.

The controller 4110 may include at least one of a microprocessor, a digital signal processor, a microcontroller, and/or logic devices that may perform similar functions to these devices. The I/O device 4120 may include a keypad, a keyboard, and/or a display. The memory device 4131 may store data and/or commands. The memory device adaptor 4130 may include at least one of the memory card adaptors according to the above-described embodiments of the inventive concepts. The memory device 4131 may include a semiconductor memory device in any of various forms (for example, a non-volatile memory device and/or an SRAM device). Data may be transmitted to or received from a communication network via the interface 4140. The interface 4140 may be in a wired or wireless form. For example, the interface 4140 may include an antenna and/or a wired/wireless transceiver. Although not illustrated, the electronic system 4100 may further include, as an operational memory device to improve an operation of the controller 4110, a high-speed dynamic random access memory (DRAM) device and/or an SRAM device.

The electronic system 4100 may be applied to a personal digital assistant (PDA), portable computer, a web tablet, a wireless phone, a mobile phone, a digital music player, or any electronic products that transmit and/or receive information in a wireless environment.

Figure 14:
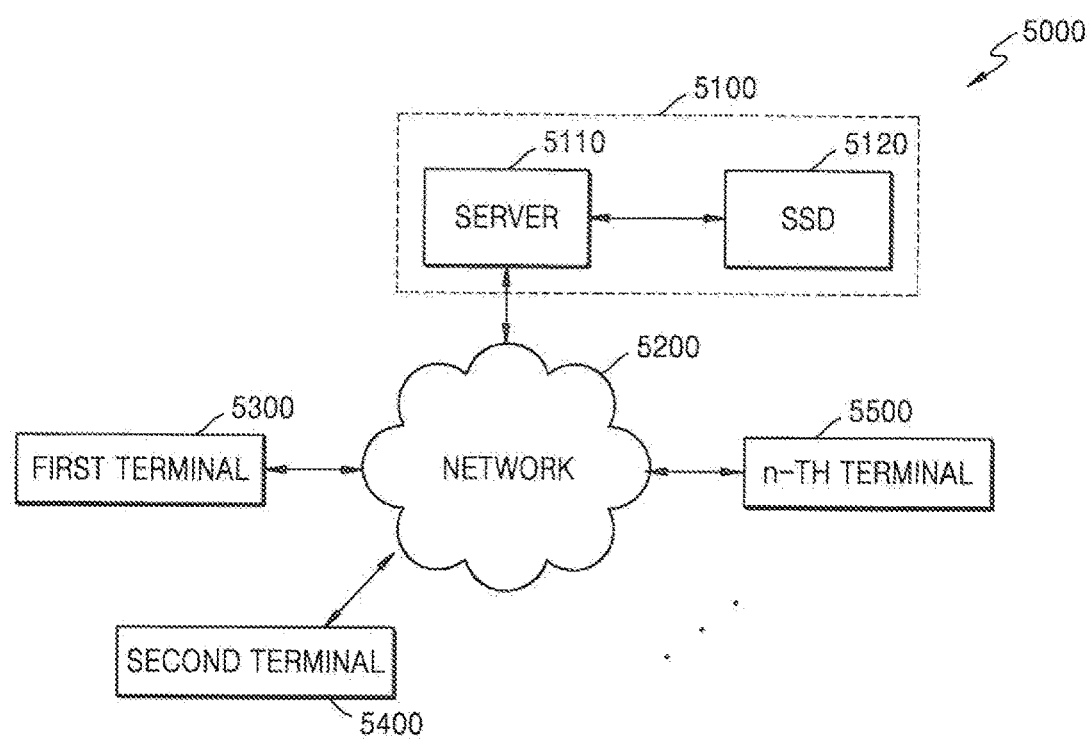
FIG. 14 is a block diagram illustrating an implementation example of a network for a server system that includes a memory card adaptor according to embodiments of the inventive concepts.

FIG. 14 is a block diagram illustrating an example of a network 5200 for a server system 5100 that includes a memory card adaptor according to embodiments of the inventive concepts.

Referring to FIG. 14, the network system 5000 may include the server system 5100 and a plurality of terminals 5300, 5400, and 5500 that may be connected via the network 5200. The server system 5100 may include a server 5110 that processes requests received from the terminals 5300, 5400, and 5500 connected to the network 5200, and an electronic device 5120 that stores data corresponding to the requests received from the terminals 5300, 5400, and 5500. The electronic device 5120 may include, for example, at least one of the memory card adaptors according to the embodiments illustrated in FIGS. 3-10. The electronic device 5120 may be implemented by using, for example, an SSD.

The electronic device 5120 according to the inventive concepts may be mounted by using various types of packages, e.g., a package on package (POP), a ball grid array (BGA), a chip scale package (CSP), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flat pack (TQFP), a small-outline integrated circuit (SOIC), a shrink small outline package (SSOP), a thin small outline package (TSOP), a system in package (SIP), a multi chip package (MCP), a wafer-level fabricated package (WFP), and a wafer-level processed stack package (WSP).

While the inventive concepts have been particularly shown and described with reference to example embodiments thereof, it will be understood that various changes in form and details may be made therein without departing from the spirit and scope of the following claims.

What is claimed is:

1. A memory card adaptor comprising:
   a plurality of card-side terminals arranged to contact terminals of a memory card;
   a plurality of socket-side terminals arranged in a first direction to contact terminals of a host socket, the plurality of socket-side terminals comprising at least two socket-side ground terminals;
   wiring lines configured to electrically connect the plurality of card-side terminals to the plurality of socket-side terminals in a one-to-one correspondence;
   a ground frame configured to electrically connect the at least two socket-side ground terminals to each other; and
   a housing accommodating the plurality of card-side terminals, the plurality of socket-side terminals, and the wiring lines,
   wherein the ground frame comprises a first ground sub-frame thatextends along side surfaces of the at least two socket-side ground terminals.

2. The memory card adaptor of claim 1, wherein the first ground sub-frame overlaps with front end side surfaces of the plurality of socket-side terminals.

3. The memory card adaptor of claim 1, wherein the ground frame further comprises a second ground sub-frame extending in a second direction that is perpendicular to the first direction.

4. The memory card adaptor of claim b, wherein the first ground sub-frame overlaps with front end side surfaces of the plurality of socket-side terminals, and
   the first ground sub-frame is connected to a second ground sub-frame that extends in, a second direction that is perpendicular to the first direction.

5. The memory card adaptor of claim 1, wherein the ground frame further comprises a third ground sub-frame that is adjacent to the plurality of card-side terminals and is electrically connected to the first ground sub-frame.

6. The memory card adaptor of claim 5, wherein the third ground sub-frame extends in the first direction.

7. The memory card adaptor of claim 5, wherein the plurality of card-side terminals comprise at least one card-side ground terminal, and
   the third ground sub-frame is electrically connected to the at least one card-side ground terminal and is not electrically connected to the at least two socket-side ground terminals.

8. The memory card adaptor of claim 1, wherein the ground frame encompasses the plurality of socket-side terminals, the wiring lines, and the plurality of card-side terminals.

9. The memory card adaptor of claim 1, wherein the ground frame is a closed loop.

10. The memory card adaptor of claim 9, wherein the closed loop comprises two closed sub-loops that share one of the plurality of card-side terminals.

11. The memory card adaptor of claim 1, wherein the ground frame at least partially meets a plane that is formed by upper surfaces of the plurality of socket-side terminals or a plane that is formed by lower surfaces of the plurality of socket-side terminals.

12. The memory card adaptor of claim 5, wherein the ground frame further comprises a fourth ground sub-frame that is spaced apart from the wiring lines and extends over the wiring lines.

13. The memory card adaptor of claim 12, wherein the fourth ground sub-frame is connected to one of the wiring lines that is connected to one of the at least two socket-side ground terminals.

14. The memory card adaptor of claim 1, wherein the plurality of card-side terminals are configured according to an interface standard of a Secure Digital (SD) card, a miniSD card, a microSD card, a multimedia card, a reduced size multimedia card, a Universal Flash Storage (UFS) card, or a Universal Serial Bus (USB) memory storage device.

15. The memory card adaptor of claim 1, wherein the wiring lines are formed on a printed circuit board (PCB).

16. A memory card adaptor comprising:
- a plurality of first terminals having a first arrangement and comprising a ground terminal;
- a plurality of second terminals having a second arrangement and electrically connected to the plurality of first terminals in a one-to-one correspondence;
- a ground frame electrically connected to the ground terminal, and encompassing the plurality of first terminals and the plurality of second terminals; and
- a housing accommodating the, plurality of first terminals, the plurality of second terminals, and the ground frame, wherein the ground frame forms a closed loop.

17. The memory card adaptor of claim 16, wherein the closed loop comprises two closed sub-loops that share the ground terminal.

18. A memory card adaptor comprising;
- first terminals;
- second terminals electrically connected to the first terminals in a one-to-one correspondence;
- a housing accommodating the first terminals and the second terminals; and
- a ground frame extending along side surfaces of the housing, and encompassing the first terminals and the second terminals, wherein the ground frame forms a closed loop.

19. The memory card adaptor of claim 18, wherein the ground frame extends along an external side surface of the housing.

20. The memory card adaptor of claim 18, wherein the first terminals are arranged to contact terminals of a memory card.

* * * * *